US011189327B2

(12) United States Patent
Prather et al.

(10) Patent No.: US 11,189,327 B2
(45) Date of Patent: Nov. 30, 2021

(54) METHODS FOR PROVIDING DEVICE STATUS IN RESPONSE TO READ COMMANDS DIRECTED TO WRITE-ONLY MODE REGISTER BITS AND MEMORY DEVICES AND SYSTEMS EMPLOYING THE SAME

(71) Applicant: Micron Technology, Inc., Boise, ID (US)

(72) Inventors: Matthew A. Prather, Boise, ID (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/815,999

(22) Filed: Mar. 11, 2020

(65) Prior Publication Data
US 2021/0057003 A1    Feb. 25, 2021

Related U.S. Application Data

(60) Provisional application No. 62/889,954, filed on Aug. 21, 2019.

(51) Int. Cl.
*G11C 7/10*     (2006.01)
*G06F 11/30*    (2006.01)
*G11C 11/4093*  (2006.01)

(52) U.S. Cl.
CPC ........ *G11C 7/1045* (2013.01); *G06F 11/3037* (2013.01); *G06F 11/3058* (2013.01); *G11C 7/1051* (2013.01); *G11C 7/1078* (2013.01); *G11C 11/4093* (2013.01)

(58) Field of Classification Search
CPC ............... G11C 7/1045; G11C 7/1051; G11C 11/4093; G11C 7/1078; G06F 11/3058; G06F 11/3037
See application file for complete search history.

(56) References Cited

U.S. PATENT DOCUMENTS

| | | | |
|---|---|---|---|
| 2009/0150701 A1* | 6/2009 | Nagao | G11C 7/1072 713/324 |
| 2010/0177587 A1* | 7/2010 | Huang | G11C 11/4096 365/230.08 |
| 2013/0227219 A1 | 8/2013 | Ueki et al. | |
| 2018/0357076 A1 | 12/2018 | Wietfeldt et al. | |
| 2019/0103154 A1* | 4/2019 | Cox | G11C 7/227 |

OTHER PUBLICATIONS

International Application No. PCT/US2020/042340—PCT International Search Report and Written Opinion, dated Oct. 27, 2020, 11 pages.

\* cited by examiner

*Primary Examiner* — Ajay Ojha
(74) *Attorney, Agent, or Firm* — Perkins Coie LLP

(57) ABSTRACT

Memory devices, memory systems, and methods of operating the same are disclosed in which a memory device, in response to receiving a mode register read (MRR) command directed to one or more write-only bits of a mode register, reads data indicative of a status of the memory device about the memory device from one or more cells of a memory array of the memory device that are different from the write-only mode register. The data can include device settings, environmental conditions, usage statistics, metadata, feature support, feature implementation, device status, temperature, etc. The status information mode can be optionally enabled or disabled. The memory devices can include DDR5 DRAM memory devices.

26 Claims, 4 Drawing Sheets

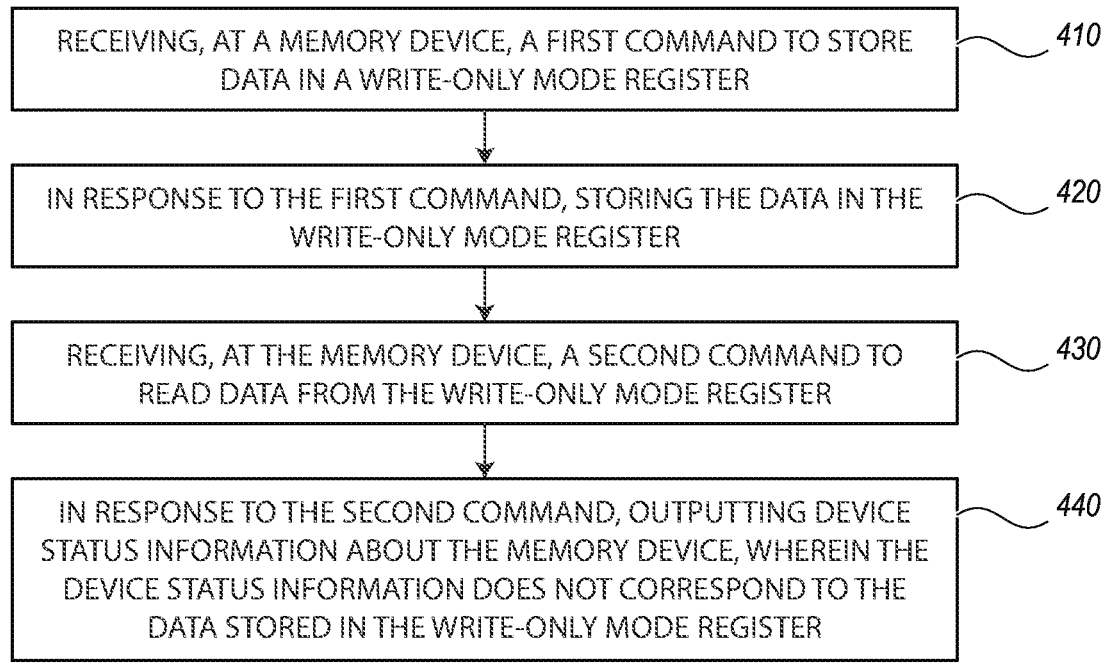

METHODS FOR PROVIDING DEVICE STATUS IN RESPONSE TO READ COMMANDS DIRECTED TO WRITE-ONLY MODE REGISTER BITS AND MEMORY DEVICES AND SYSTEMS EMPLOYING THE SAME

CROSS-REFERENCE TO RELATED APPLICATION(S)

This application claims the benefit of U.S. Provisional Application No. 62/889,954, filed Aug. 21, 2019; which is incorporated herein by reference in its entirety.

TECHNICAL FIELD

The present disclosure generally relates to methods for providing status read from write-only mode register bits and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

FIG. 4 is a flow chart illustrating a method of operating a memory device in accordance with an embodiment of the present technology.

DETAILED DESCRIPTION

Memory devices frequently include, in addition to large memory arrays dedicated to the storage of system and/or user data, separate storage areas such as mode registers used to store device status information (e.g., device settings, environmental conditions, usage statistics, metadata, feature support, feature implementation, device status, temperature, etc.). Although many of these mode registers are provided with either read-only or read/write capability, design constraints (as set forth in greater detail below) can sometimes limit the functionality of some of the mode register bits, such that read operations thereon are unreliable, forbidden, or otherwise not possible. One approach to dealing with write-only bits is to configure them such that mode register write (MRW) commands directed to these bits result in a write operation as intended, but such that mode register read (MRR) commands directed to these bits result in a return of no data (e.g., returning a zero for the contents of these bits, regardless of the actual data stored therein). Providing no response (e.g., returning zero) to MRR commands directed to these write-only bits results in wasted bus bandwidth, which in many applications can result in sub-optimal memory device performance.

Accordingly, several embodiments of the present technology are directed to memory devices, systems including memory devices, and methods of operating memory devices in which a memory device, in response to a mode register read command directed to a write-only mode register bit, returns device status information (e.g., device settings, environmental conditions, usage statistics, metadata, feature support, feature implementation, device status, temperature, etc.) not stored in the targeted write-only mode register bit. This arrangement enjoys several benefits, such as improved bus utilization and reduced time obtaining data indicative of a status of the memory device (e.g., device status information).

Figure 1:
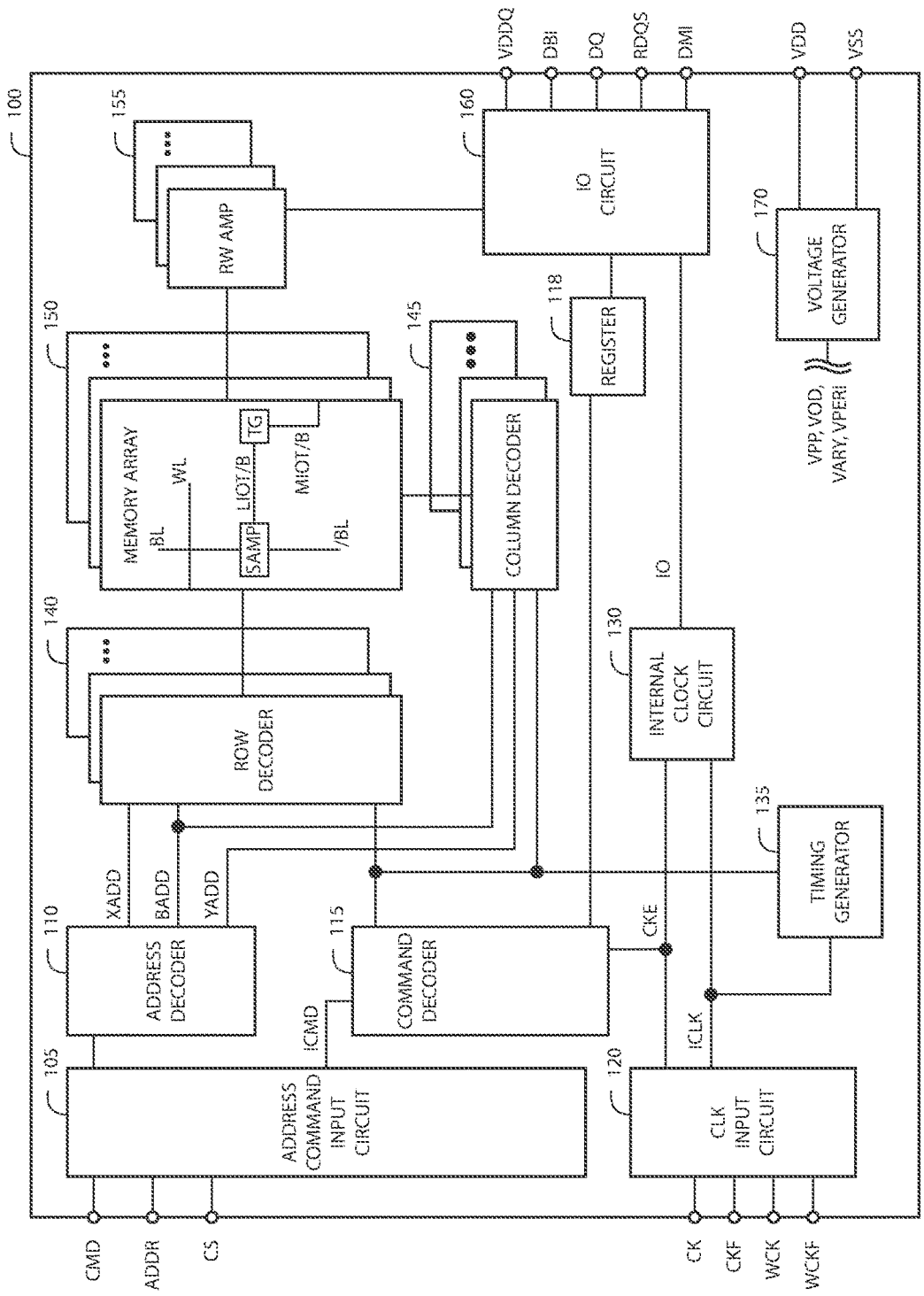
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The 10 clock signals can be supplied to the input/output circuit 160 and can be used as a timing signal for determining an output timing of read data and the input timing of write data. The 10 clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 may further include one or more registers 118 for storing various data (e.g., device status information). Mode registers 118 may include read-only bits, read-write bits, write-only bits, or any combination thereof. In some embodiments, mode registers 118 may be arranged in byte-sized addressable portions, with each individually-addressable mode register containing 8 bits. The read-write and write-only mode register bits may be written in response to mode register write (MRW) commands in which the data to be written is provided over the CA interface, and the read-write and read-only mode register bits may be read from in response to mode register read (MRR) commands in which the stored data output through the DQ data terminals. The mode registers 118 may also be read and written internally by various components of the memory device 100 (e.g., populating read-only mode register bits with device status information, determining a status of a write-only mode register bit, etc.), but without exchanging data with a terminal of the memory device.

Some mode registers can be located centrally (e.g., in a region of the memory device dedicated to storing mode registers), with control circuitry spread across the device to connect the central mode registers to the circuits in which the information they store is utilized. Other mode registers, however, can be physically located near the circuits for which the mode registers store relevant settings. Because some of these mode registers are therefore located in regions of the memory device that are crowded with additional circuitry, and because the circuit that would be used to provide readability of those mode registers through a MRR command can be bulky, these mode registers may not be provided with a circuit for reading the mode register (or specific bits within them) in response to a MRR command, and may therefore be considered write-only (or to include write-only bits). Although the information stored in these write-only mode registers (or write-only mode register bits) may still be accessible to the memory device itself, which may access the information therein during operation of the memory device (e.g., using the status of the mode register bit as an input into a circuit-implemented state machine), the inability to output the information therein in response to a MRR command means that the information is generally not available to a user of the memory device. One approach to responding to a MRR command to read the information out of the write-only registers or bits involves returning a predetermined bit (e.g., usually 0). The drawbacks to this approach, however, include poor bus utilization and accordingly sub-optimal memory device performance.

According to one embodiment of the present disclosure, a memory device such as memory device 100 can be configured to respond to MRR commands directed to write-only bits of a mode register (such as mode register 118) by returning device status information not stored in the write-only bits targeted by the MRR command. The device status information configured to be returned can include any of a number of different types of information, including, e.g., feature implementation, feature support, device capability, device status, device configuration, environmental information (e.g., temperature), and the like. By returning device status information in response to a MRR command directed to a write-only mode register bit, bus utilization can be improved and additional device status information about the memory device can be made more readily available.

For example, in accordance with one embodiment of the present disclosure, a byte-sized mode register may be configured to store information about refresh functions of a DRAM memory device. Such an exemplary mode register is illustrated in Table 1, below.

TABLE 1

| Function | Register Type | Operand | Data |
|---|---|---|---|
| Refresh Rate | R | OP [2:0] | $000_B$: RFU<br>$001_B$: tREFI x1 (1x Refresh Rate), <80° C. nominal<br>$010_B$: tREFI x1 (1x Refresh Rate), 80-85° C. nominal<br>$011_B$: tREFI/2 (2x Refresh Rate), 85-90° C. nominal<br>$100_B$: tREFI/2 (2x Refresh Rate), 90-95° C. nominal<br>$101_B$: tREFI/2 (2x Refresh Rate), >95° C. nominal<br>$110_B$: RFU<br>$111_B$: RFU |
| Refresh Interval Rate Indicator | SR/W | OP [3] | DRAM Status Read (SR):<br>$0_B$: Not implemented (Default)<br>$1_B$: Implemented<br>Host Write (W):<br>$0_B$: Disabled (Default)<br>$1_B$: Enabled |
| Refresh tRFC Mode | R/W | OP [4] | $0_B$: Normal Refresh Mode (tRFC1)<br>$1_B$: Fine Granularity Refresh Mode (tRFC2) |
| RFU (Reserved for Future Use) | RFU | OP [6:5] | RFU |
| TUF (Temperature Update Flag) | R | OP [7] | $0_B$: No change in OP [3:1] since last MR4 read (default)<br>$1_B$: Change in OP [3:1] since last MR4 read |

As can be seen with reference to Table 1, the MR bit with operand OP[3] stores information received from the host indicating whether incoming refresh commands from the host will include a specified refresh rate. Although this bit is a write-only bit (e.g., not readable by a MRR command), the memory device can be configured to return device status information regarding whether the memory device supports a refresh optimization function (e.g., in which the memory device can make use of a specified refresh rate received from the host). In use, the OP[3] bit will store either a 0 or a 1, to indicated whether the Refresh Internal Rate Indication function is provided by the host (i.e., with a 1) or not (i.e., with a 0). When this OP[3] bit is targeted by a MRR operation, however, rather than returning the stored value in the register, the memory device will return device status information indicating whether support for the refresh optimization feature is implemented (i.e., with a 1) or not (i.e., with a 0) by the memory device.

In other embodiments, other device status information could be provided in response to a MRR command targeting one or more write-only mode register bits, including device temperature, device status, device configuration, or the like. In this regard, in accordance with one aspect of the subject disclosure, the device status information to be returned in response to a MRR command targeting a particular write-only mode register bit may be specified in another mode register, such that the information can be user-configurable.

In accordance with another aspect of the present disclosure, the foregoing approach to providing device status information in response to a MRR command targeting one or more write-only mode register bits can be enabled or disabled by an end user of the memory device and/or memory modules. For example, in an embodiment in which the feature is configurable, the feature may be enabled or disabled by changing a corresponding mode register value. Other approaches to enabling and disabling the foregoing feature may also be used, such as sending a command to the memory device, changing an applied voltage to a memory device input, or the like.

Figure 2:
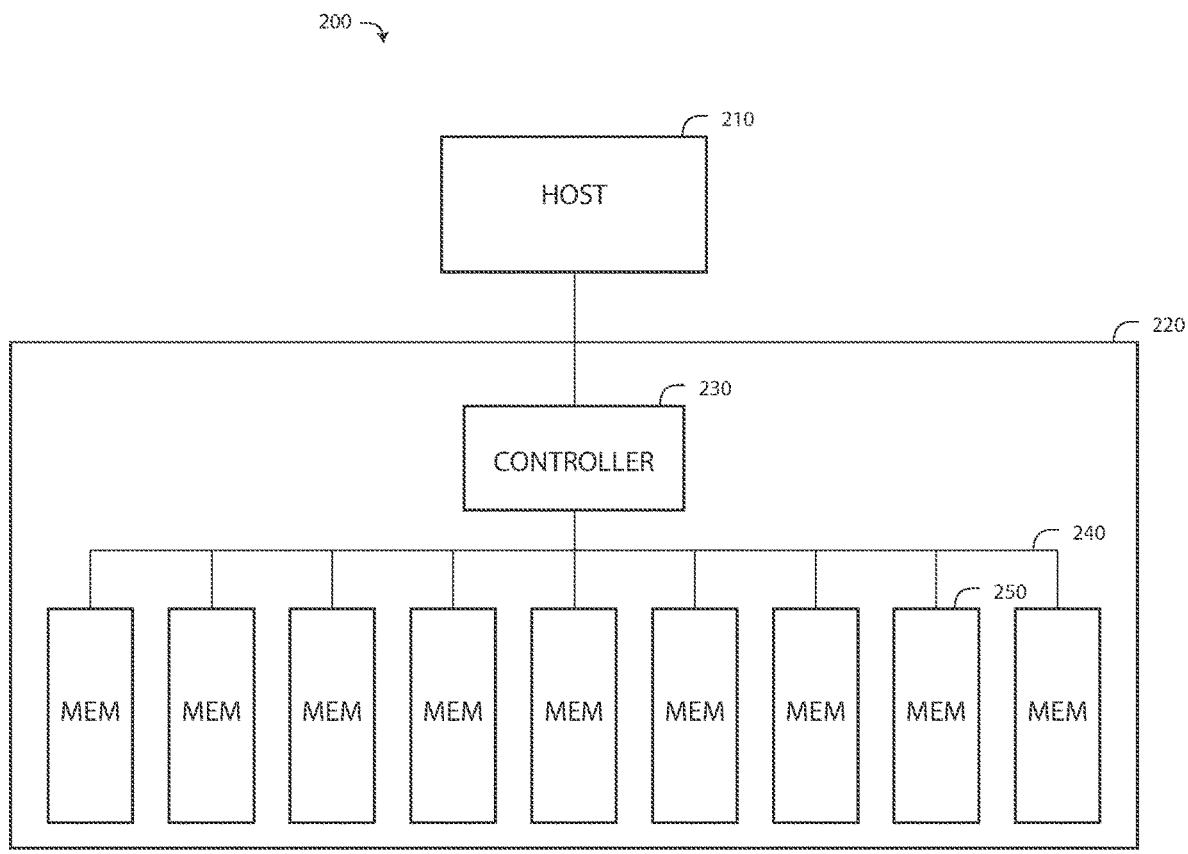
FIG. 2 is a simplified block diagram schematically illustrating a memory system in accordance with an embodiment of the present technology.

FIG. 2 is a simplified block diagram schematically illustrating a memory system 200 in accordance with an embodiment of the present technology. Memory system 200 includes a host device 210 operably coupled to a memory module 220 (e.g., a dual in-line memory module (DIMM)). Memory module 220 can optionally include a controller 230 operably connected by a bus 240 to a plurality of memory devices 250. Memory module 220 can optionally include a registering clock driver (RCD) in addition to or in lieu of the controller 230.

Figure 3:
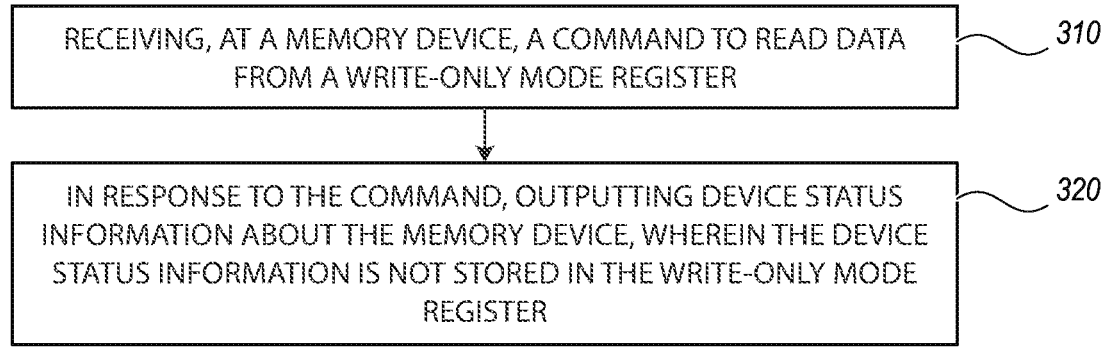
FIG. 3 is a flow chart illustrating a method of operating a memory device in accordance with an embodiment of the present technology.

FIG. 3 is a flow chart illustrating a method of operating a memory system (e.g., a memory module including one or more memory devices) in accordance with an embodiment of the present technology. The method includes receiving, at a memory device, a command to read data from a write-only mode register (box 310). According to one aspect of the present disclosure, the receiving features of box 310 may be implemented with the command/address input circuit 105, as illustrated in FIG. 1 in greater detail, above. The method further includes reading and/or outputting, in response to the command, device status information about the memory device, wherein the device status information is not stored in the write-only mode register (box 320). According to one aspect of the present disclosure, the outputting features of box 320 may be implemented with input/output circuit 160, as illustrated in FIG. 1 in greater detail, above.

FIG. 4 is a flow chart illustrating a method of operating a memory system (e.g., a memory module including one or more memory devices) in accordance with an embodiment of the present technology. The method includes receiving, at a memory device, a first command to store data in a write-only mode register (box 410). According to one aspect of the present disclosure, the receiving features of box 410 may be implemented with the command/address input circuit 105, as illustrated in FIG. 1 in greater detail, above. The method further includes storing, in response to the first command, the data in the write-only mode register (box 420). According to one aspect of the present disclosure, the storing features of box 420 may be implemented with the mode register 118, as illustrated in FIG. 1 in greater detail, above. The method further includes receiving, at a memory device, a second command to read data from a write-only mode register (box 430). According to one aspect of the present disclosure, the receiving features of box 430 may be implemented with the command/address input circuit 105, as illustrated in FIG. 1 in greater detail, above. The method further includes reading and/or outputting, in response to the second command, device status information about the memory device, wherein the device status information is not stored in the write-only mode register (box 440). According to one aspect of the present disclosure, the outputting features of box 440 may be implemented with input/output circuit 160, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having nine memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method comprising:
   receiving, at a memory device, a command to read data from a write-only mode register; and
   in response to the command, reading, from one or more cells of a memory array of the memory device that are different from the write-only mode register, data indicative of a status of the memory device.

2. The method of claim 1, further comprising determining that a status information mode of the memory device is enabled, and wherein reading the data is based at least in part on the determination.

3. The method of claim 2, wherein determining that the status information mode of the memory device is enabled includes reading a setting stored in another mode register of the memory device.

4. The method of claim 1, wherein the data indicative of the status of the memory device comprises device settings, environmental conditions, usage statistics, metadata, feature support, feature implementation, device status, temperature, or a combination thereof.

5. The method of claim 1, wherein the command is a mode register read (MRR) command.

6. The method of claim 1, wherein the memory device is a dynamic random-access memory (DRAM) device.

7. A method comprising:
   sending a command to read data from a write-only mode register of a memory device; and
   in response to the command, receiving data indicative of a status of the memory device,
      wherein the data is stored in one or more cells of an array of the memory device that are different from the write-only mode register.

8. The method of claim 7, further comprising enabling a status information mode of the memory device, and wherein receiving the data is based at least in part on the enabling.

9. The method of claim 8, wherein enabling the status information mode of the memory device includes writing a setting to another mode register of the memory device.

10. The method of claim 7, wherein the data indicative of the status of the memory device comprises device settings, environmental conditions, usage statistics, metadata, feature support, feature implementation, device status, temperature, or a combination thereof.

11. The method of claim 7, wherein the command is a mode register read (MRR) command.

12. The method of claim 7, wherein the memory device is a dynamic random-access memory (DRAM) device.

13. A memory device comprising:
    a memory array;
    a mode register including at least one write-only mode register bit; and
    circuitry configured, in response to a command to read data from the at least one write-only mode register bit, to read from one or more cells of the memory array that are different from the write-only mode register data indicative of a status of the memory device.

14. The memory device of claim 13, wherein the circuitry is further configured to determine that a status information mode of the memory device is enabled, and wherein reading the data is based at least in part on the determination.

15. The memory device of claim 14, wherein the circuitry is configured to determine that the status information mode of the memory device is enabled by reading a setting stored in another mode register of the memory device.

16. The memory device of claim 13, wherein the data indicative of the status of the memory device comprises device settings, environmental conditions, usage statistics, metadata, feature support, feature implementation, device status, temperature, or a combination thereof.

17. The memory device of claim 13, wherein the command is a mode register read (MRR) command.

18. The memory device of claim 13, wherein the memory device is a dynamic random-access memory (DRAM) device.

19. A memory system comprising:
    a host device; and
    a memory device operably coupled to the host device, the memory device including:
       a memory array,
       a write-only mode register bit, and
       circuitry configured, in response to a command to read data from the write-only mode register bit, to read data indicative of a status of the memory device from one or more cells of the array that are different from the write-only mode register bit.

20. The memory system of claim 19, wherein the circuitry is further configured to determine that a status information mode of the memory device is enabled, and wherein the circuitry is configured to read the data based at least in part on the determination.

21. The memory system of claim 20, wherein the circuitry is configured to determine that the status information mode of the memory device is enabled by reading a setting stored in another mode register of the memory device.

22. The memory system of claim 19, wherein the data indicative of the status of the memory device comprises device settings, environmental conditions, usage statistics, metadata, feature support, feature implementation, device status, temperature, or a combination thereof.

23. The memory system of claim 19, wherein the command is a mode register read (MRR) command.

24. The memory system of claim 19, wherein the memory device is a dynamic random-access memory (DRAM) device.

25. A method comprising:
receiving, at a memory device, a first command to store first data in a write-only mode register;
in response to the first command, storing the first data in the write-only mode register;
receiving, at the memory device, a second command to read from the write-only mode register; and
in response to the second command, outputting second data indicative of a status of the memory device, wherein the second data does not correspond to the first data stored in the write-only mode register.

26. A method comprising:
sending a first command to write first data to a write-only mode register of a memory device; and
sending a second command to read from the write-only mode register; and
in response to the second command, receiving second data indicative of a status of the memory device, wherein the second data does not correspond to the first data.

* * * * *